(12) United States Patent
Bhardwaj et al.

(10) Patent No.: US 10,114,796 B2
(45) Date of Patent: Oct. 30, 2018

(54) EFFICIENT IMPLEMENTATION OF CASCADED BIQUADS

(71) Applicant: Texas Instruments Incorporated, Dallas, TX (US)

(72) Inventors: Asheesh Bhardwaj, Allen, TX (US); Lester A Longley, Atlanta, GA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 428 days.

(21) Appl. No.: 14/515,041

(22) Filed: Oct. 15, 2014

(65) Prior Publication Data

US 2016/0112033 A1    Apr. 21, 2016

(51) Int. Cl.
*G06F 17/10*        (2006.01)
*H03H 17/04*       (2006.01)

(52) U.S. Cl.
CPC ............. *G06F 17/10* (2013.01); *H03H 17/04* (2013.01); *H03H 2017/0494* (2013.01)

(58) Field of Classification Search
CPC ..... H03H 2017/0488; H03H 2017/009; H03H 2017/0081
See application file for complete search history.

(56) References Cited

U.S. PATENT DOCUMENTS

| 4,679,001 | A  | * | 7/1987 | West ...................... H04Q 1/457 327/556 |
| 2014/0059101 | A1 | * | 2/2014 | Steele ................ H03H 17/0223 708/300 |
| 2016/0112033 | A1 | * | 4/2016 | Bhardwaj ............... G06F 17/10 708/300 |

FOREIGN PATENT DOCUMENTS

WO    WO 2015140113 A1 *   9/2015   ........... G06F 9/5066

* cited by examiner

*Primary Examiner* — David H Malzahn
(74) *Attorney, Agent, or Firm* — Kenneth Liu; Charles A. Brill; Frank D. Cimino

(57) ABSTRACT

An improved biquad infinite impulse response filter is shown that may be implemented in a very large instruction word digital signal processor as well as in other processing circuitry. The new filter structure modifies the feedback path in the filter, resulting in a significant reduction in execution cycles.

20 Claims, 4 Drawing Sheets

EFFICIENT IMPLEMENTATION OF CASCADED BIQUADS

TECHNICAL FIELD OF THE INVENTION

The technical field of this invention is digital signal processing, and more particularly to infinite impulse response filters.

BACKGROUND OF THE INVENTION

One of the most-used digital filter forms is the biquad. A biquad is a second order (two poles and two zeros) Infinite Impulse Response (IIR) filter. It is high enough order to be useful on its own, and because of the coefficient sensitivities in higher order filters the biquad is often used as the basic building block for more complex filters. For instance, a biquad low pass filter has a cutoff slope of 12 dB/octave, useful for tone controls; if a 24 dB/octave filter is needed, you can cascade two biquads and it will have less coefficient sensitivity problems than a single fourth-order design.

Biquads come in several forms. The most obvious, a direct implementation of the second order differential equation ($y[n]=a0*x[n]+a1*x[n-1]+a2*x[n-2]-b1*y[n-1]-b2*y[n-2]$), is called direct form I and is shown in FIG. 1.

Direct form I is the best choice for implementation in a fixed point processor because it has a single summation point.

We can take direct form I and split it at the summation point as shown in FIG. 2, and then take the two halves and swap them, so that the feedback half (the poles) comes first as shown in FIG. 3. Now one pair of z delays is redundant, storing the same information as the other pair. Merging the two pairs yields the direct form II configuration shown in FIG. 4.

In floating point applications, direct form II is preferred because it reduces memory requirements, and floating point computation is not sensitive to overflow in the way fixed point computations are.

We can improve on this configuration by transposing the filter. To transpose a filter, the signal flow direction is reversed. Output becomes input, distribution nodes become summers, and summers become nodes as shown in FIG. 5. The characteristics of the filter are unchanged, but in this case the floating point characteristics are better. Floating point computation has better accuracy when intermediate sums are with closer values (adding small numbers to large numbers in floating point is less precise than with similar values).

SUMMARY OF THE INVENTION

An improved biquad filter that is optimized for wide instruction word digital signal processors. The feedback path of the filter is modified, resulting in significant performance improvements.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
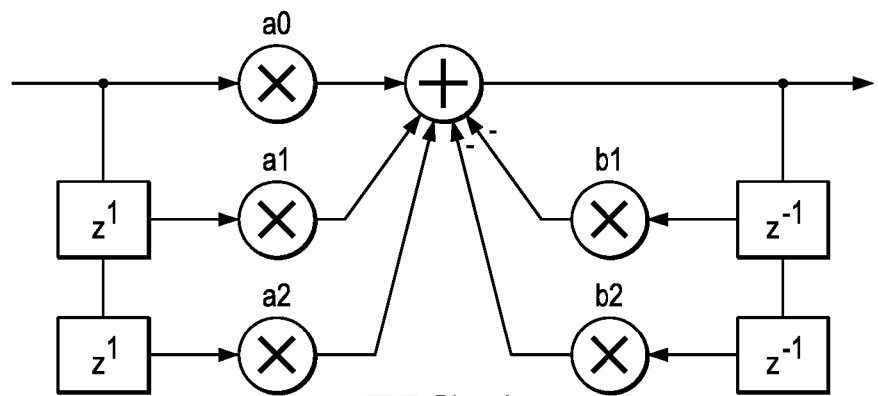
FIG. 1 shows a direct form I biquad filter.
Figure 2:
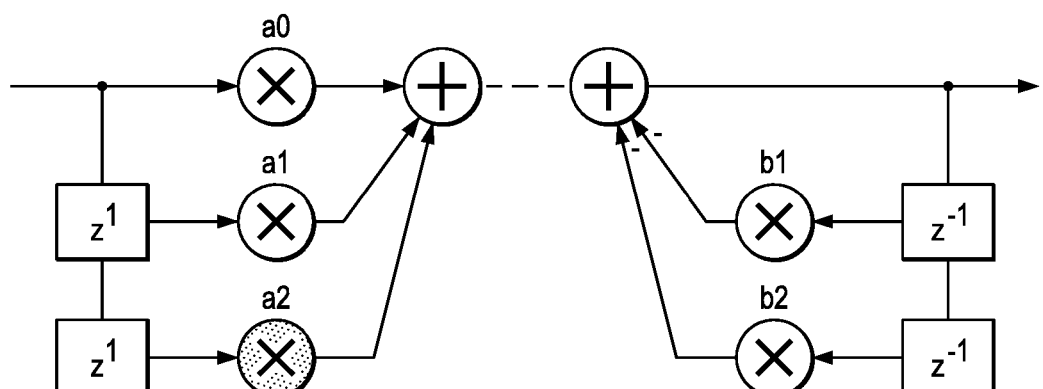
FIGS. 2 and 3 show intermediate forms of the biquad.
Figure 3:
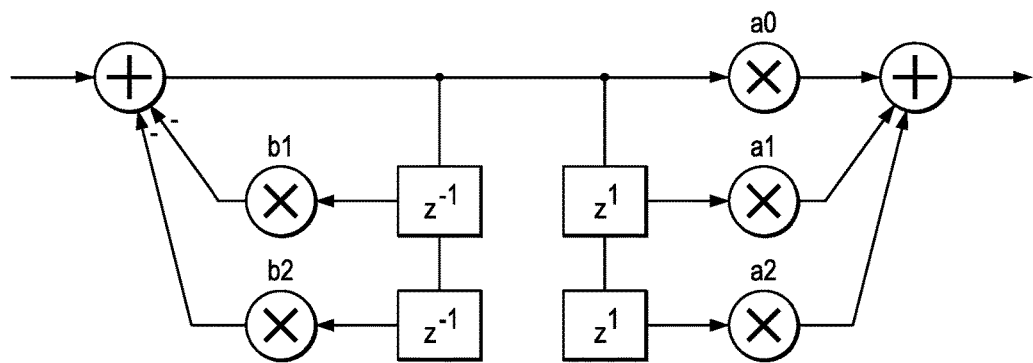
Figure 4:
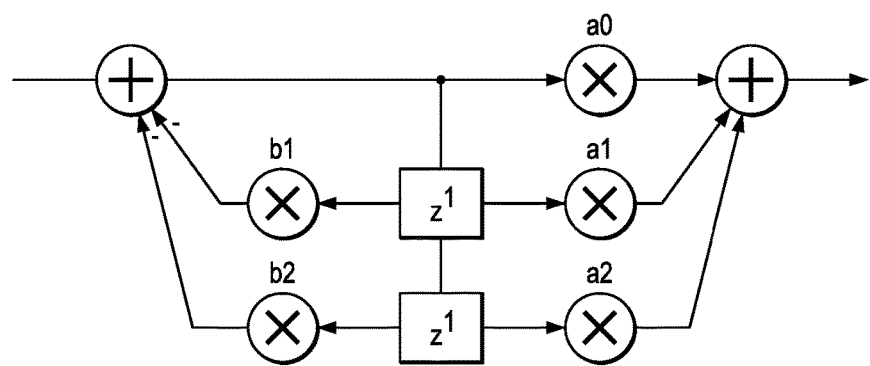
FIG. 4 shows a direct form II biquad filter.
Figure 5:
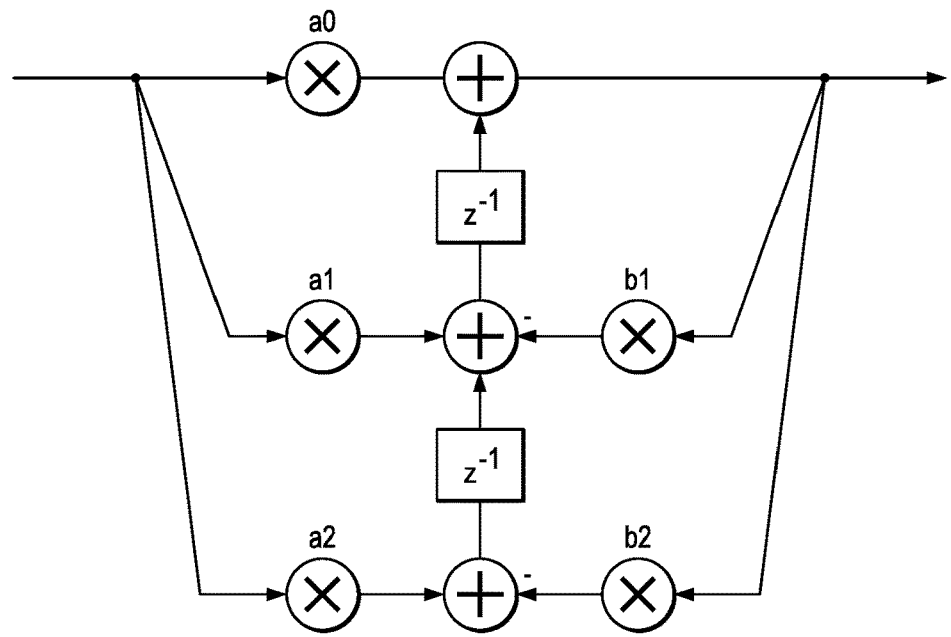
FIG. 5 is a transposed form II biquad.
Figure 6:
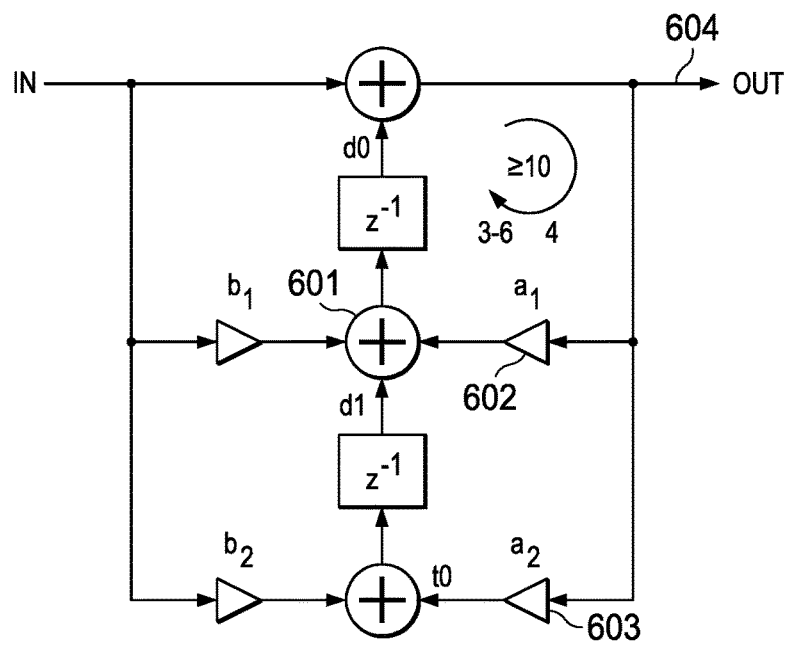
FIG. 6 illustrates an implementation of a biquad filter on a DSP.

FIG. 6 shows the transposed direct form II structure used in some implementations in Texas Instruments Digital Signal Processors (DSP). These implementations require more than 10 cycles in the feedback path. Three to 6 cycles are used in addition block 601, and 4 cycles in multipliers 602 and 603. As shown in the figure, the feedback path to multipliers 602 and 603 originates at the output 604.

Figure 7:
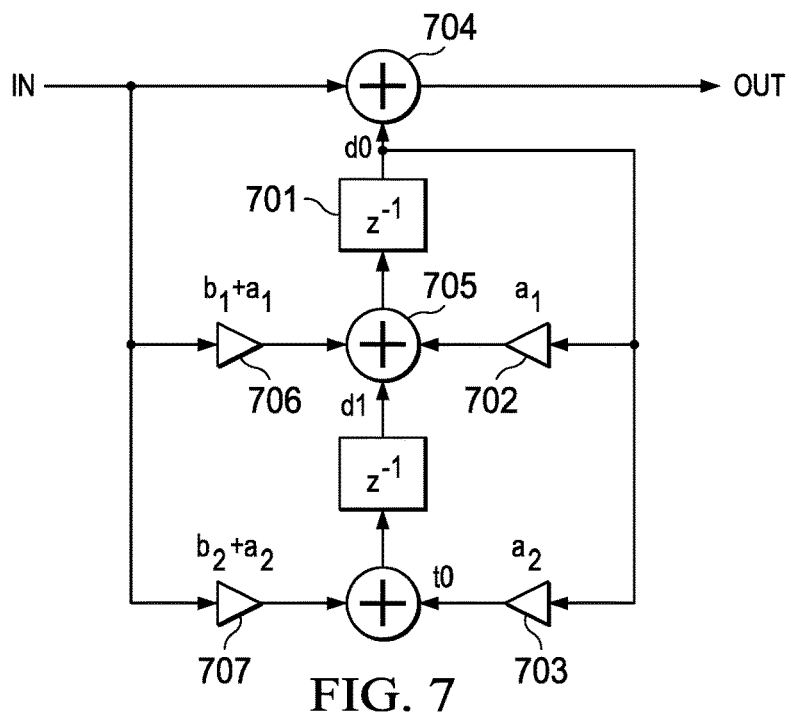
FIG. 7 shows a modified biquad implementation.

FIG. 7 shows an improved implementation described in this invention. The feedback path to multipliers 702 and 703 originates from the output of storage element 701 instead of the output of summation block 704. The coefficient in multiplier 706 is changed from b1 to b1+a1, and the coefficient in multiplier 707 is changed from b2 to b2+a2. This improvement results in requiring 7 cycles in the overall feedback path, 3 cycles in addition block 705 and 4 cycles in multipliers 702 and 703.

Figure 8:
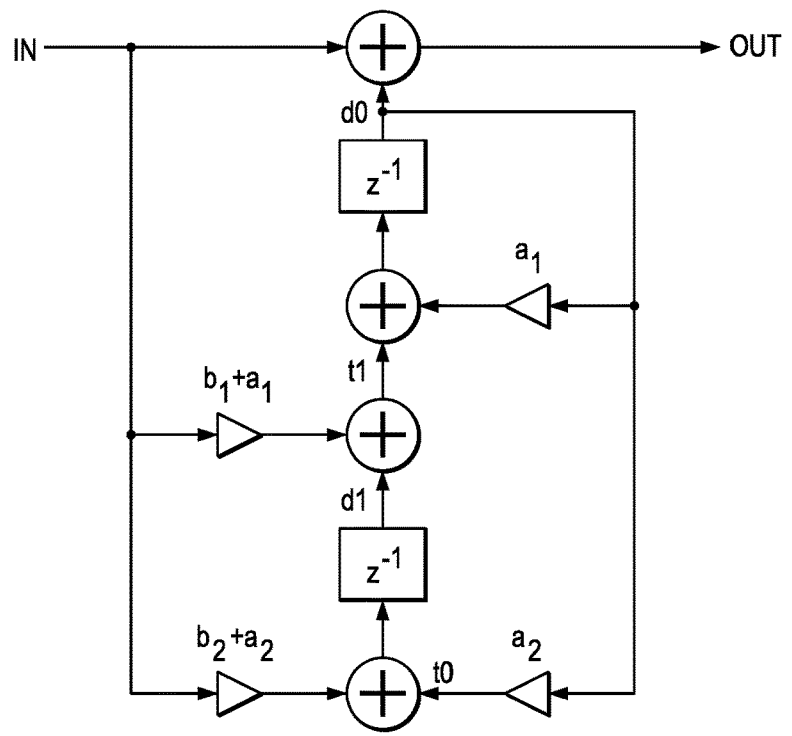
FIG. 8 shows a comparison of prior art and implementation according to this invention.

FIG. 8 further demonstrates the implementation of this invention. The signal flow in the prior art is shown in table 1, and Table 2 shows the signal flow with the improved feedback path.

TABLE 1 out = in + d0
d0 = b1 * in + a1 * out + d1
d1 = b2 * in + a2 * out

TABLE 2 out = in + d0
t1 = (b1 + a1) * in + d1
t0 = a2 * d0
d0 = a1 * d0 + t1
d1 = (b2 + a2) * in + t0

Table 3 shows performance benchmarks of the improved biquad filter executing on Texas Instruments C674x and C66x digital signal processors using single precision 32-bit floating point arithmetic, and Table 4 benchmarks filter performance using mixed/double precision floating point arithmetic on the same digital signal processors.

TABLE 3

| Function | Exclusive cycle count C674x per biquad | Exclusive cycle count C66x per biquad | C66x/C674x Improvement | C674x bytes | C66x bytes | Comments C674xx | Comments C66x |
|---|---|---|---|---|---|---|---|
| Cascade Biquad | 4.5 | 4 | 1.11x | 268 | 416 | Loop Carried | Loop Carried |

TABLE 3-continued

| Function | Exclusive cycle count C674x per biquad | Exclusive cycle count C66x per biquad | C66x/C674x Improvement | C674x bytes | C66x bytes | Comments C674xx | Comments C66x |
|---|---|---|---|---|---|---|---|
| 1 Channel 2 stage | | | | | | Dependency Bound 8, Resource bound is 4 | Dependency Bound 16, Resource bound is 7 Loop Unroll 2x |
| Cascade Biquad 2 channel 4-stage, same coefficient | 2.125 | 1.375 | 1.35x | 1128 | 904 | Loop Carried Dependency Bound 8, Resource bound is 16 | Loop Carried Dependency Bound 10, Resource bound is 8 |
| Cascade Biquad 2 channel 3-stage, same coefficient | 2 | 1.33 | 1.34x | 536 | 656 | Loop Carried Dependency Bound 10, Resource bound is 12 | Loop Carried Dependency Bound 8, Resource bound is 7 |

TABLE 4

| Cascaded Biquad | Exclusive cycle count C674x per biquad | Exclusive cycle count C66x per biquad | C66x/C674x Improvement | Comments C674xx | Comments C66x |
|---|---|---|---|---|---|
| 1 Channel 2 stage Single Precision | 4.5 | 4 | 1.11x | Loop Carried Dependency Bound 8, Resource bound is 4 | Loop Carried Dependency Bound 16, Resource bound is 7 Loop Unroll 2x |
| 1 Channel 2 stage, same coefficient, Mixed/Double Precision | 9.75 | 4 | 2.4x | Loop Carried Dependency Bound 37, Resource Bound is 32 Loop Unroll 2x | Loop Carried Dependency Bound 10, Resource Bound is 10 |
| 1 Channel 3 stage, same coefficient, Mixed/Double Precision | 15.33 | 3.33 | 4.6x | Loop Carried Dependency Bound 20, Resource Bound is 24 | Loop Carried Dependency Bound 8, Resource Bound is 9 |
| 2 Channel 2 stage, same coefficient, Mixed/Double Precision | 15.25 | 3.5 | 4.36x | Loop Carried Dependency Bound 17, Resource Bound is 32 | Loop Carried Dependency Bound 7, Resource Bound is 14 |

What is claimed is:

1. A infinite impulse response (IIR) filter comprising:
an input terminal to receive an input signal;
an output terminal to output an output signal;
a first multiplier circuit to multiply the input signal by the sum of a first filter coefficient and a second filter coefficient to produce a first signal, the first multiplier circuit having an input to receive the input signal and an output to output the first signal;
a second multiplier circuit to multiply the input signal by the sum of a third filter coefficient and a fourth filter coefficient to produce a second signal, the second multiplier circuit having an input to receive the input signal and an output to output the second signal;
a third multiplier circuit to multiply a feedback signal by the first filter coefficient to produce a third signal, the third multiplier circuit having an input to receive the feedback signal and an output to output the third signal;
a fourth multiplier circuit to multiply the feedback signal by the third filter coefficient to produce a fourth signal, the fourth multiplier circuit having an input to receive the feedback signal and an output to output the fourth signal;
a first summing circuit to sum the second and fourth signals to produce a fifth signal, the first summing circuit having first and second inputs to receive the second and fourth signals, respectively, and an output to output the fifth signal;
a first delay circuit to receive the fifth signal and apply a first delay thereto to produce a sixth signal, the first delay circuit having an input to receive the fifth signal and an output to output the sixth signal;
a second summing circuit to sum the first, third, and sixth signals to produce a seventh signal, the second summing circuit having first, second, and third inputs to receive the first, third, and sixth signals, respectively, and an output to output the seventh signal;

a second delay circuit to receive the seventh signal and apply a second delay thereto to produce an eighth signal, the second delay circuit having an input to receive the seventh signal and an output to output the eighth signal; and a third summing circuit to sum the input signal and the eighth signal to produce the output signal;

wherein the eighth signal is the feedback signal.

2. The IIR filter of claim 1, wherein the first and second delays applied by the first and second delay circuits, respectively, are equal.

3. The IIR filter of claim 1, wherein the IIR filter is a second order filter.

4. The IIR filter of claim 3, wherein:
the second order filter is a two-pole two-zero filter;
the first and third coefficients correspond to poles of the two-pole two-zero filter; and
the second and fourth coefficients correspond to zeros of the two-pole two-zero filter.

5. The IIR filter of claim 3, wherein the IIR filter is a biquad filter.

6. A data processing device comprising:
a infinite impulse response (IIR) filter comprising:
an input terminal to receive an input signal;
an output terminal to output an output signal;
a first multiplier circuit to multiply the input signal by the sum of a first filter coefficient and a second filter coefficient to produce a first signal, the first multiplier circuit having an input to receive the input signal and an output to output the first signal;
a second multiplier circuit to multiply the input signal by the sum of a third filter coefficient and a fourth filter coefficient to produce a second signal, the second multiplier circuit having an input to receive the input signal and an output to output the second signal;
a third multiplier circuit to multiply a feedback signal by the first filter coefficient to produce a third signal, the third multiplier circuit having an input to receive the feedback signal and an output to output the third signal;
a fourth multiplier circuit to multiply the feedback signal by the third filter coefficient to produce a fourth signal, the fourth multiplier circuit having an input to receive the feedback signal and an output to output the fourth signal;
a first summing circuit to sum the second and fourth signals to produce a fifth signal, the first summing circuit having first and second inputs to receive the second and fourth signals, respectively, and an output to output the fifth signal;
a first delay circuit to receive the fifth signal and apply a first delay thereto to produce a sixth signal, the first delay circuit having an input to receive the fifth signal and an output to output the sixth signal;
a second summing circuit to sum the first, third, and sixth signals to produce a seventh signal, the second summing circuit having first, second, and third inputs to receive the first, third, and sixth signals, respectively, and an output to output the seventh signal;
a second delay circuit to receive the seventh signal and apply a second delay thereto to produce an eighth signal, the second delay circuit having an input to receive the seventh signal and an output to output the eighth signal; and
a third summing circuit to sum the input signal and the eighth signal to produce the output signal;
wherein the eighth signal is the feedback signal.

7. The data processing device of claim 6, wherein the first and second delays applied by the first and second delay circuits, respectively, of the IIR filter are equal.

8. The data processing device of claim 7, wherein the first and second delays applied by the first and second delay circuits, respectively, of the IIR filter are each equal to one unit delay.

9. The data processing device of claim 6, wherein the IIR filter is a second order filter.

10. The data processing device of claim 9, wherein:
the second order filter is a two-pole two-zero filter;
the first and third coefficients correspond to poles of the two-pole two-zero filter; and
the second and fourth coefficients correspond to zeros of the two-pole two-zero filter.

11. The data processing device of claim 9, wherein the IIR filter is a biquad filter.

12. The data processing device of claim 6, wherein the data processing device comprises a digital signal processor.

13. The data processing device of claim 12, wherein the digital signal processor is a very long instruction word (VLIW) digital signal processor.

14. A infinite impulse response (IIR) filter comprising:
an input terminal to receive an input signal;
an output terminal to output an output signal;
a first multiplier circuit to multiply the input signal by the sum of a first filter coefficient and a second filter coefficient to produce a first signal, the first multiplier circuit having an input to receive the input signal and an output to output the first signal;
a second multiplier circuit to multiply the input signal by the sum of a third filter coefficient and a fourth filter coefficient to produce a second signal, the second multiplier circuit having an input to receive the input signal and an output to output the second signal;
a third multiplier circuit to multiply a feedback signal by the first filter coefficient to produce a third signal, the third multiplier circuit having an input to receive the feedback signal and an output to output the third signal;
a fourth multiplier circuit to multiply the feedback signal by the third filter coefficient to produce a fourth signal, the fourth multiplier circuit having an input to receive the feedback signal and an output to output the fourth signal;
a first summing circuit to sum the second and fourth signals to produce a fifth signal, the first summing circuit having first and second inputs to receive the second and fourth signals, respectively, and an output to output the fifth signal;
a first delay circuit to receive the fifth signal and apply a first delay thereto to produce a sixth signal, the first delay circuit having an input to receive the fifth signal and an output to output the sixth signal;
a second summing circuit to sum the first and sixth signals to produce a seventh signal, the second summing circuit having first and second inputs to receive the first and sixth signals, respectively, and an output to output the seventh signal;
a third summing circuit to sum the third and seventh signals to produce an eighth signal, the third summing circuit having first and second inputs to receive the third and seventh signals, respectively, and an output to output the eighth signal;

a second delay circuit to receive the eighth signal and apply a second delay thereto to produce a ninth signal, the second delay circuit having an input to receive the eighth signal and an output to output the ninth signal; and a fourth summing circuit to sum the input signal and the ninth signal to produce the output signal, the fourth summing circuit having first and second inputs to receive the input signal and the ninth signal, respectively, and an output to output the output signal;

wherein the ninth signal is the feedback signal.

15. The IIR filter of claim 14, wherein the IIR filter is a second order filter.

16. The IIR filter of claim 14, wherein the IIR filter is a biquad filter.

17. A data processing device comprising:

a infinite impulse response (IIR) filter comprising:

an input terminal to receive an input signal;

an output terminal to output an output signal;

a first multiplier circuit to multiply the input signal by the sum of a first filter coefficient and a second filter coefficient to produce a first signal, the first multiplier circuit having an input to receive the input signal and an output to output the first signal;

a second multiplier circuit to multiply the input signal by the sum of a third filter coefficient and a fourth filter coefficient to produce a second signal, the second multiplier circuit having an input to receive the input signal and an output to output the second signal;

a third multiplier circuit to multiply a feedback signal by the first filter coefficient to produce a third signal, the third multiplier circuit having an input to receive the feedback signal and an output to output the third signal;

a fourth multiplier circuit to multiply the feedback signal by the third filter coefficient to produce a fourth signal, the fourth multiplier circuit having an input to receive the feedback signal and an output to output the fourth signal;

a first summing circuit to sum the second and fourth signals to produce a fifth signal, the first summing circuit having first and second inputs to receive the second and fourth signals, respectively, and an output to output the fifth signal;

a first delay circuit to receive the fifth signal and apply a first delay thereto to produce a sixth signal, the first delay circuit having an input to receive the fifth signal and an output to output the sixth signal;

a second summing circuit to sum the first and sixth signals to produce a seventh signal, the second summing circuit having first and second inputs to receive the first and sixth signals, respectively, and an output to output the seventh signal;

a third summing circuit to sum the third and seventh signals to produce an eighth signal, the third summing circuit having first and second inputs to receive the third and seventh signals, respectively, and an output to output the eighth signal;

a second delay circuit to receive the eighth signal and apply a second delay thereto to produce a ninth signal, the second delay circuit having an input to receive the eighth signal and an output to output the ninth signal; and a fourth summing circuit to sum the input signal and the ninth signal to produce the output signal, the fourth summing circuit having first and second inputs to receive the input signal and the ninth signal, respectively, and an output to output the output signal;

wherein the ninth signal is the feedback signal.

18. The data processing device of claim 17, wherein the first and second delays applied by the first and second delay circuits, respectively, of the IIR filter are equal.

19. The data processing device of claim 17, wherein the IIR filter is a two-pole two-zero second order filter, the first and third coefficients correspond to poles of the two-pole two-zero filter, and the second and fourth coefficients correspond to zeros of the two-pole two-zero filter.

20. The data processing device of claim 17, wherein the IIR filter is a biquad filter.

* * * * *